United States Patent [19]
Adler

[11] 3,935,031
[45] Jan. 27, 1976

[54] PHOTOVOLTAIC CELL WITH ENHANCED POWER OUTPUT

[75] Inventor: Alan D. Adler, West Redding, Conn.

[73] Assignee: New England Institute, Inc., Ridgefield, Conn.

[22] Filed: May 7, 1973

[21] Appl. No.: 357,852

[52] U.S. Cl. .................... 136/206; 136/89; 29/572
[51] Int. Cl. ............................................. H01v 1/28
[58] Field of Search ................. 136/89, 206; 29/572

[56] References Cited
UNITED STATES PATENTS

| | | | |
|---|---|---|---|
| 3,225,208 | 12/1965 | Wolfe | 136/206 |
| 3,331,707 | 7/1967 | Werth | 136/89 |
| 3,539,883 | 11/1970 | Harrison | 136/206 |

*Primary Examiner*—Verlin R. Pendegrass
*Attorney, Agent, or Firm*—Peter L. Berger

[57] ABSTRACT

The photovoltage and photocurrent, and therefore, the power output of photovoltaic cells (solar cells) are markedly enhanced by depositing, on an exposed semiconductor surface of a solar cell, a layer of any one of a very large number of prophyrinic compounds.

13 Claims, 3 Drawing Figures

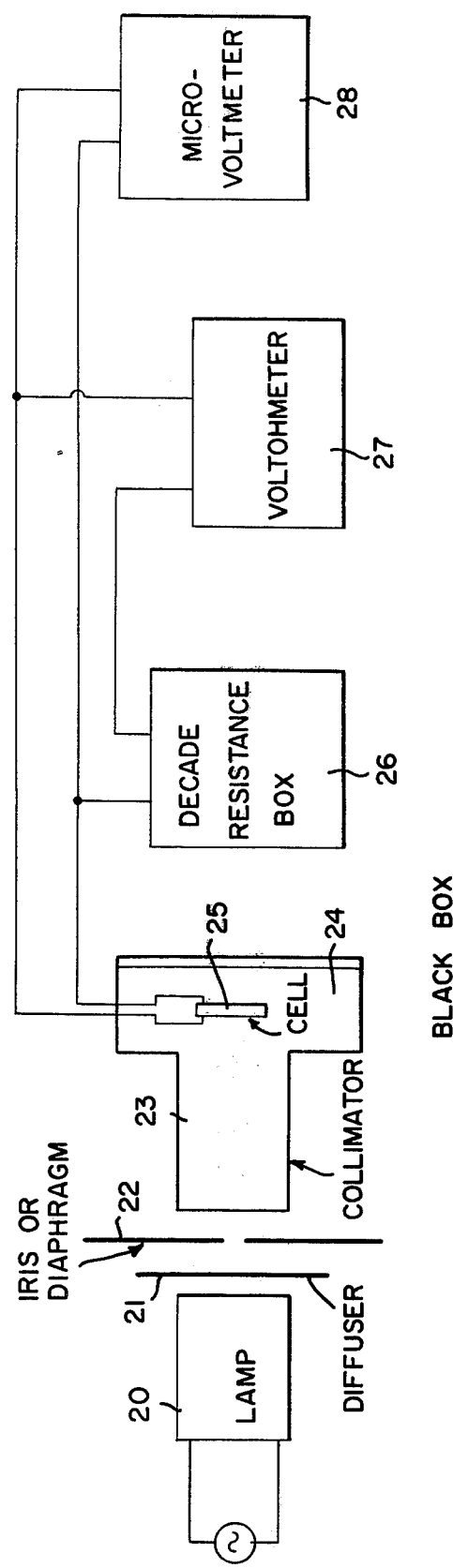

PHOTOVOLTAIC CELL WITH ENHANCED POWER OUTPUT

BACKGROUND OF THE INVENTION

1. Field of the Invention

The invention relates to photovoltaic cells and in particular to such cells which have been modified by depositing on an exposed semiconductor surface thereof, a layer of a porphyrinic compound. Such modified cells have markedly enhanced power output characteristics as compared with the unmodified cells. The invention also relates to methods for producing such modified cells.

2. Prior Art

Photovoltaic cells, as well as their construction, use and theory of operation are known. Generally, these cells comprise a light sensitive semiconductor material, for example, Se, CdS, Si or the like, which, upon being irradiated with light, will produce an electric current that is related to the intensity and wavelength of the source of irradiation. Thus, semiconductor materials and cells made therefrom are a valuable source of energy, and in fact, such cells, also known as solar cells, are presently in use in a wide variety of applications where energy sources are scarce and sunlight is plentiful. The voltage and current, and hence the power output of these cells is severely restricted by the nature and size of the cells as well as the intensity of the available light. Accordingly, any enhancement in the power output of such cells would be most desirable and would constitute a valuable advance in the art.

I have been experimenting with the physical effects of the class of chemical substances known as porphyrins and the present invention is a result of that experimentation. The porphyrins are, of course, well known. There are numerous natural porphyrins and the literature abounds with references to the synthesis of both natural and previously unknown porphyrins.

The present invention represents the application of a newly discovered interaction of the porphyrins to the known properties of photovoltaics, the result being a remarkable and wholly unexpected enhancement of the power output capability of the known photovoltaics.

SUMMARY OF THE INVENTION

I have now discovered that when an exposed semiconductor surface of a photovoltaic cell is coated with a layer, ranging in thickness from a monomolecular layer to a thickness of up to one micron, of any one of a vast number of porphyrins, the photovoltage and the photocurrent of the cell are markedly enhanced.

Accordingly, in one aspect thereof, the invention is an improved photovoltaic cell wherein the semiconductor portion thereof is coated with a layer of a porphyrinic compound.

In another aspect, the invention is a method of producing such improved photovoltaic cells by depositing thereon a layer of a porphyrinic compound.

In yet another aspect, the invention is a method of enhancing the power output of a conventional photovoltaic cell by depositing thereon a layer of a porphyrinic compound.

As used herein, the terms "porphyrin" and "porphyrinic compound" are intended to mean any compound, whether natural or synthetic, which includes or derives from the basic porphin structure:

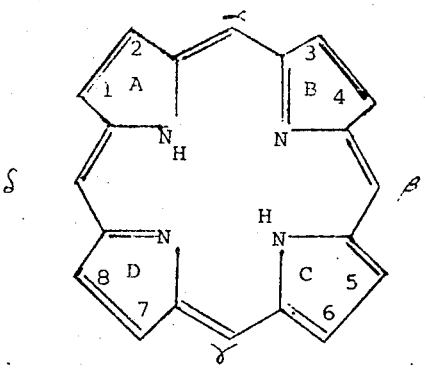

In this structure, any one or more of the eight numbered $\beta,\beta'$-positions on the four pyrrole rings A, B, C, and D may be substituted with any one of a large number of substituents. Likewise, any one or more of the hydrogen atoms of the four methene bridges ($\alpha,\beta,\gamma,\delta$) as well as the hydrogen atoms on the central nitrogen atoms may also be substituted to give rise to innumerable porphyrin derivatives, all of which are within the scope of the invention.

In the above structure, which is porphin itself, the molecule consists of four heterocycles of pyrrole rings labelled A, B, C, D joined to one another at their $\alpha,\alpha'$ positions by methene bridges (labelled $\alpha,\beta,\gamma,\delta$) into a closed macrocycle called the porphyrin ring system. In porphin itself the $\beta,\beta'$ positions of the constituent pyrroles (labelled 1 through 8) and the bridge carbons ($\alpha$ through $\delta$) and two of the pyrrole nitrogens all contain hydrogen atoms. All of these hydrogens can be replaced to obtain new structures. Alternatively, further hydrogens can be added (reducing these positions) at carbons 1 to 8 thereby reducing these carbon atoms and, also, at the $\alpha$ to $\delta$ methene bridges and the "free" nitrogens to also derive new structures.

A large number of derivatives are obtained from naturally occurring porphyrins with different alkyl and carboxylated alkyl groups (e.g., protoporphyrin IX which is 1, 3, 5, 8-tetramethyl-2, 4-divinyl-6, 7-carboethoxyporphin). See, for example, Lemberg & Legge, "Hematin Compounds and Bile Pigments," Interscience Publishers, New York (1949); Falk, J. E., "Porphyrins and Metalloporphyrins", Elsevier, Amsterdam (1964); and Vernon, et al., "The Chlorophylls", Academic Press, New York (1966).

These derivatives may be further modified by adding halogen and/or other common substituent functional groups; Caughey, et al, Org. Chem. 31, 2631 (1966). Alternatively, almost any other sets of groupings can be put on at positions 1 through 8 by direct synthesis (e.g., 1,2,3,4,5,6,7,8 octamethylporphin); Fischer, et al., "Die Chemie des Pyrrols", Akademische Verlagsgesellschaft, Leipzig (1934); also available as Johnson Reprint, New York (1968). Similarly, almost any set of functional groups (alkyl, aryl, heterocyclic, halogenated, etc.) can be obtained by laboratory synthesis on the methene bridges (i.e., substituted $\alpha,\beta,\gamma,\delta$). These are usually synthesized as symmetric ms tetraphenylporphin) though not necessarily (e.g., $\alpha,\beta,\gamma,\delta$ tetra phenyl-1,2,3,4,5,6,7,8 octamethyl porphin); Dolphin, D., J. Heterocyclic Chem., 7, 275 (1970).

Another whole series of structures can be obtained by synthesizing molecules with nitrogens at the bridge positions in place of the methene carbons (i.e., tetraazaporphin or porphyrazine); Linstead, et al., J. Chem. Soc., 4839 (1952). These can be synthesized readily with symmetric substitutions on positions 1 through 8 (e.g., Baguley, et al., J. Chem. Soc. 3521 (1955). Note that since the valence of nitrogen is one less than carbon, there does not exist a corresponding series of bridge substituted derivatives (i.e., $\alpha,\beta,\gamma,\delta$). Alternatively, one can substitute only one, two, or three of the bridge carbons with nitrogen (i.e., mono, di- or triazaporphins), (Fischer et al, supra). If one fuses two adjacent positions of each of four benzene rings to each of the four $\beta,\beta'$ positions of the pyrroles in either porphin or porphyrazine, then one obtains respectively benzoporphin and phthalocyanine each of which is also the basis for another whole series of structures.

All of these structures can exist in several redox states of the macrocyclic ring system. One and two electron oxidation states have recently been reported and similarly, one electron reduction states (e.g., $\pi$ cation radicals). Better characterized structures are di, tetra, and hexahydro porphins. These reductions can be either on the $\beta,\beta'$ positions (i.e., 1 to 8) or on the methene bridges and adjacent "free" nitrogens (i.e., $\alpha,\beta,\gamma,\delta$). Reduction of one ring (A,B,C, or D) produces a so-called chlorin (e.g., 1,2-dihydroporphins) and reduction of two opposite rings produces a so-called bacteriochlorin (e.g., 1,2,5,6-tetrahydroporphin) and these are the most stable of these various ring redox state structures and therefore they are readily obtainable in solid form.

Moreover, all of these structures, including the various redox states, can exist in a series of acid-base salts, formed both at the central nitrogen or further with any acidic or basic substituent groupings. For the central nitrogens both mono- and di- cations and anions have been reported. The most characterized and readily obtainable structures as solids are the various diacid salts (e.g., the dihydrochlorides).

Again, all of these structures can form metal salts or chelates with a wide variety of metals. These metalloderivatives themselves can exist in several different valence states of the metals (e.g., $Fe^{+2}$ and $Fe^{+3}$) and with various counterions, ligands, or coordination complexes (e.g., diimidazole ferric ms-tetraphenylporphin chloride).

Further, all of the previous structures (ring variants, redox states, metalloderivatives, ligates, etc.) can be incorporated into polymers (both synthetic and natural - e.g. proteins) or into a whole series of various van der Waal's complexes, i.e., charge transfer complexes, acceptor-donor complexes, $\pi$-$\pi$ complexes, etc.

It is thus seen that a very large number of structures related to porphin can be prepared or synthesized. Including all the above variations, several thousands of the same have already been reported in the literature. See also, Adler, A. D., J. Poly. Sci. (C), 29, 73 (1970); Adler, et al, J. Org. Chem. 32, 476 (1967); Treibs, et al, J. Am. Chem., 718, 183 (1968); Moser, et al., "Phthalocyanine Compounds", Reinhold, New York (1963); Adler, et al., J. Inorg. Nucl. Chem. 32, 2443 (1970); Dolphin, et al., Am. N.Y. Acad. Sci., 112, 510 (1964); Brown, et al, Can. J. Chem. 36, 371 (1958); Linstead, et al., J. Chem. Soc. 911 (1937); and Busch, et al., Adv. Chem. Series, 100, 44 (1971).

BRIEF DESCRIPTION OF THE DRAWING

FIG. 3 is a block diagram of apparatus used to measure the output of cells according to the invention.

DETAILED DESCRIPTION OF THE INVENTION

An International Rectifier barrier layer selenium cell, Model (B2M) was obtained from Edmund Scientific Company. This cell has an active cell area of 0.26 sq. in. and an average power output of 0.004mW at 1 ft. candle under a 20,000 ohm load.

Figure 1:
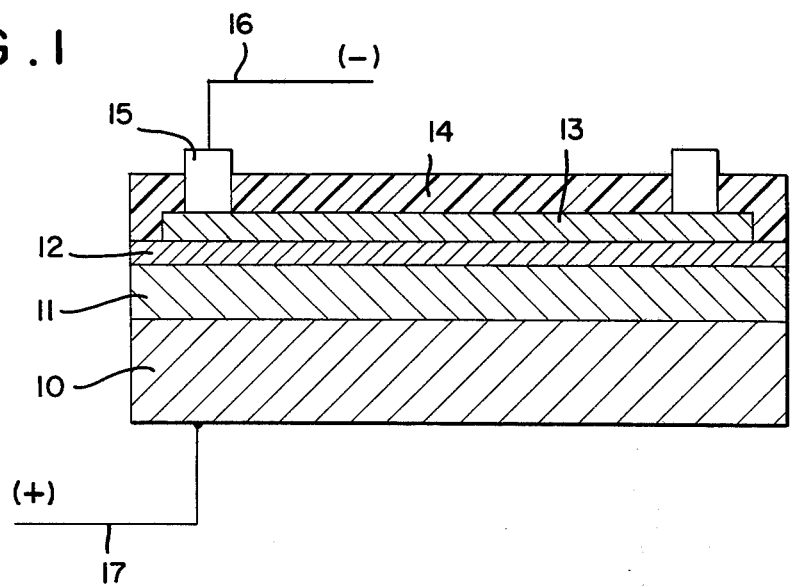
FIG. 1 is a cross sectional view of a conventional selenium barrier layer photocell.

This cell comprises, as seen in FIG. 1, a base plate 10, which is a positive electrode, a layer of selenium 11 on top of the base plate 10, a barrier layer 12 between selenium layer 11 and a transparent front electrode 13. Barrier layer 12 acts as a gate which prevents electrons travelling from selenium layer 11 to front electrode 13 from travelling backwards to the selenium layer 11. The front electrode 12 is connected to the external load (not shown) through collector strip 15 by means of negative lead 16, while the base plate 10 is connected to the external load through positive lead 17. A protective plastic coating 14 is on top of the photosensitive surface of the cell and covers barrier layer 12 and front electrode 13.

To prepare the cell according to the present invention, the protective plastic coating 14 must be removed. This can be done in a number of ways. For example, the plastic can be softened with a suitable solvent, such as methylene chloride or N, N-dimethylformamide and then cut off with a scalpel or picked up with a pair of tweezers. After removal of the protective coating 14, the cell is ready for modification in accordance with the invention. That is, the cell has an exposed semiconductor surface on which a layer of a porphyrinic compound can be deposited.

Figure 2:
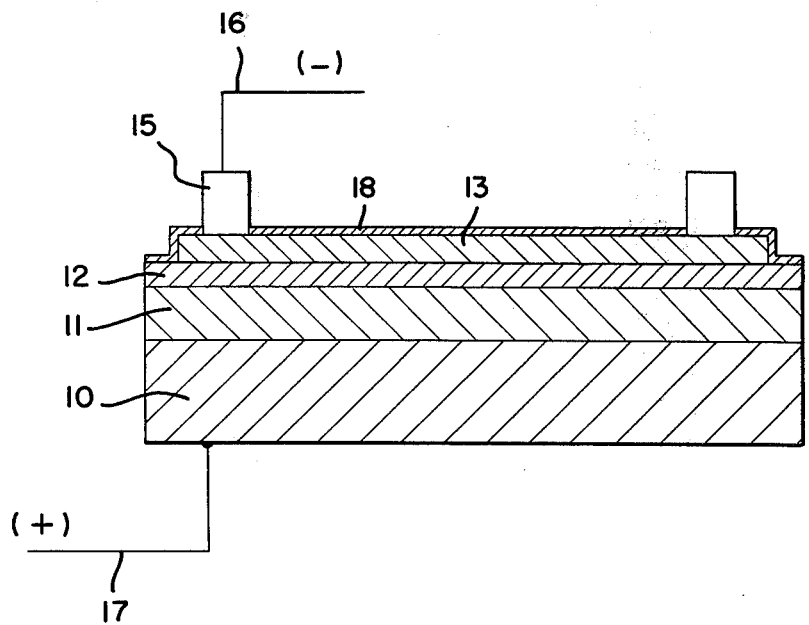
FIG. 2 is a cross sectional view of the photocell of FIG. 1 modified in accordance with the invention.

This is accomplished by preparing an ethyl acetate (or other suitable solvent) solution of the selected porphyrinic compound and spreading the solution on a Langmuir trough according to known techniques for obtaining very thin films. The film was compressed until it collapsed to a thickness of about 60A and was collected by dipping the cell into the film. As seen in FIG. 2, the cell, having its protective plastic coating removed, now has a film 18 of a porphyrinic compound deposited thereon.

Electrical measurements were conducted on the cell using a Keithley Model 151 microvoltmeter and a Simpson Model 260 voltohmeter, both in parallel with the output leads (16, 17) of the cell. The measurements were made in ambient room (fluorescent) light, unless otherwise specified. The total load in the system was about 2500 ohms. A series of measurements were conducted on the unmodified cell, the cell having its protective plastic coating removed, and the cell having one or more layers of a porphyrinic compound deposited thereon. The results of these measurements, in the order that they were taken, are given in Table I.

TABLE I

| Condition of Cell | Volts (mV) | Current (μA) | Power (μW) |
| --- | --- | --- | --- |
| unmodified cell | 36 | 14 | 0.504 |
| plastic coat removed | 20 | 8 | 0.160[1] |
| plastic coat removed cell irradiated with penlight at four inches | 50 | 20 | 1.000 |
| cell coated with one layer of TPP[2] | 32 | 12 | 0.384 |
| cell with TPP washed off using chloroform | 21 | 8 | 0.168[3] |
| cell recoated with TPP | 40 | 16 | 0.640 |
| cell rewashed with chloroform | 20 | 8 | 0.160 |
| cell recoated with TPP | 40 | 16 | 0.640 |
| cell coated with second layer of TPP on top of first layer | 42 | 17 | 0.714 |
| cell coated with third layer of TPP | 42 | 17 | 0.714 |

| Condition of Cell | Volts (MV) | Current (MV) | Power (MV) |
| --- | --- | --- | --- |
| cell heated with heat gun | 50 | 20 | 1.000 |
| cell cooled | 42 | 17 | 0.714 |
| cell irradiated with penlight at 4 inches and 540 mμ filter | 80 | 34 | 2.720 |
| cell irradiated with penlight at 4 inches and 500 mμ filter | 50 | 20 | 1.000 |
| cell washed with chloroform | 21 | 8 | 0.168 |

[1] When removing the protective plastic coating, about 40% of the active selenium is also inadvertently removed. This accounts for a loss in output of the cell when the plastic the plastic coat is removed.
[2] tetraphenylporphyrin
[3] This value is higher than the 0.160 value for the uncoated cell because the chloroform did not wash off all the TPP.

The data in Table I illustrate several interesting aspects of the invention. Thus, it is seen that the effect of the porphyrin on the output of the cell is reversible; when the porphyrin is washed off with a solvent, the cell assumes its previous characteristics. The positive temperature coefficient of the modified cell indicates that the enhancement in power output is semiconductive in nature. Moreover, this is a very important effect since, ordinarily, selenium cells have a negative temperature coefficient. The greater enhancement at 540 mμ than at 500 mμ indicates that the effects of the present invention are related to the spectral characteristics of the porphyrinic compounds which have an absorption maximum at about 630 mμ. Later experiments have shown that if too thick a layer of porphyrin is built up on the cell, the layer starts to act as a filter and the output of the cell actually begins to decrease.

The effects of the present invention are completely unexpected, because past experiments with porphyrin films have shown that porphyrins alone do not exhibit the properties that they do when used in accordance with the invention. That is, when a porphyrin film is thick enough to act as an electrical photoemitter, the internal resistance is so high as to prevent any current from being generated.

Next, a series of experiments was conducted with various porphyrinic compounds to demonstrate that the effect is not limited to any porphyrin but that all porphyrinic compounds will enhance the power output of a photocell.

The porphyrin films were deposited as described above and the measurements were also taken as described above. For each porphyrinic compound, a first, second and sometimes a third layer thereof was deposited, with measurements being taken at each step. Before a subsequent compound was deposited, the previous compound was completely washed off with a suitable solvent and the cell was brought back to its initial state of 20–21 mV and 8 μA. The results of these experiments are set forth in Table II.

TABLE II

| Porphyrinic Compound | Max. E at 600–700 mμ. | First Coat | | Second Coat | | Third Coat | | Max. Power μW | % increase in Power referred to 0.168 (Control) |
| --- | --- | --- | --- | --- | --- | --- | --- | --- | --- |
| | | V(mV) | i(μA) | V(mV) | i(μA) | V(mV) | i(μA) | | |
| tetraphenyl porphyrin | 4 | 40 | 16 | 42 | 17 | 42 | 17 | 0.714 | 425% |
| zinc octaethyl porphyrin | 3 | 32 | 12 | 40 | 16 | 40 | 16 | 0.640 | 380% |
| copper tetraphenyl porphyrin | 1 | 38 | 15 | 46 | 18 | 46 | 18 | 0.828 | 492% |
| zinc tetraphenyl porphyrin | 2 | 37 | 14 | 49 | 19 | 50 | 20 | 1.000 | 595% |
| magnesium tetraphenyl porphyrin | 10 | 36 | 14 | 48 | 19 | 49 | 19 | 0.931 | 555% |
| iron tetraphenyl porphyrin +Cl− | 4 | 42 | 16 | 50 | 20 | 50 | 20 | 1.000 | 595% |
| silver tetraphenyl porphyrin | 3 | 50 | 20 | 50 | 20 | — | — | 1.000 | 595% |
| tetra (p-cyano)phenyl porphyrin | 5 | 45 | 18 | 48 | 19 | 52 | 20 | 1.000 | 595% |
| tetra(n-propyl)phenyl porphyrin | 8 | 50 | 20 | 54 | 21 | 55 | 21 | 1.210 | 720% |
| porphin | 5 | 42 | 16 | 48 | 18 | 48 | 18 | 0.864 | 515% |

TABLE II-continued

| Porphyrinic Compound | Max. E at 600–700 mμ. | First Coat V(mV) | First Coat i(μA) | Second Coat V(mV) | Second Coat i(μA) | Third Coat V(mV) | Third Coat i(μA) | Max. Power μW | % increase in Power referred to 0.168 (Control) |
|---|---|---|---|---|---|---|---|---|---|
| tintetraphenyl porphyrin - $Cl_2$ | 11 | 50 | 20 | 53 | 21 | — | — | 1.113 | 663% |
| tetraphenyl chlorin | 30 | 50 | 20 | 55 | 22 | — | — | 1.210 | 720% |
| $TPPH_2^{+2}(TFA^-)_2$* | 35 | 62 | 25 | 64 | 26 | 65 | 26 | 1.690 | 1000% |

*$TPPH_2^{+2}(TFA^-)_2$ is di-acid tetraphenyl porphin di-flouroacetate salt

As can be seen from the data in Table II, a large number of different porphyrins all exhibit the enhancing effect of the invention, although some do so to a greater extent than others. In general, the power output is increased by about 4 to 10 times, depending on the specific compound used. It is also interesting to note that the degree of enhancement is related to the spectral characteristics of the particular porphyrin; those compounds generally absorbing most strongly in the 600–700 mμ region (which is the peak selenium absorption range) produce the greatest degree of enhancement.

A further series of experiments was conducted using a larger selenium cell than in the previous experiments. In this case, the cell was a one-half square inch active surface Vactec 157201 cell obtained from Edmund Scientific Co. (Edmund P-41502) and described in the Edmund Scientific Co. brochure entitled "Selenium Photocell," No. 711467-1, Revised, February, 1971.

Before modifying the cell in accordance with the invention, the photovoltage was measured in ambient light to determine the basic characteristics of the unmodified cell and serve as an index to indicate changes resulting from further treatment prior to actual experimentation. The protective plastic coating was then removed by softening it with N,N-dimethylformamide and removing it with a pair of fine tweezers. The active surface was then successively washed with water, acetone, and finally chloroform. A short piece of stiff buss wire was then soldered to the rear of the cell to act as a support and a back electrode for the cell. This soldering operation frequently affected the cell characteristics although removing of the plastic coating, however, did not.

Using the instrument arrangement shown in FIG. 3, the cells were now all calibrated.

In FIG. 3, a light source 20, which is a 100 watt tungsten microscope lamp obtained from American Optical-Spencer is placed behind a frosted glass diffuser 21 and an adjustable iris or diaphragm 22 to enable light of varying intensity and diffuseness to be projected onto cell 25 which is placed in a light-tight black box 24 after the light is collimated in collimator 23. The current and voltage generated by cell 25 are measured using a voltohmeter 27 and a microvoltmeter 28 connected in parallel with each other and with a decade resistance box 26 for varying the applied load on cell 25. The voltohmeter 27 is a Simpson Model 260 VOM, the microvoltmeter 28 is a Kiethley Model 151 and the resistance box 26 is a General Radio Model 1432-Z.

The cells were calibrated in the following way: (1) A working reference cell with its plastic coating removed was first checked against an unmodified master reference cell whose plastic coating was untouched and (2) then all all the experimental cells were checked against the working reference cell. For a given setting of the diaphragm the voltage and current of the reference cells were taken and then those of the experimental cells. A plot of the photoemf (or photocurrent) of the experimental cells versus the reference cells could then be used to indicate changes in behavior. The working reference cell was found to be stable in its values relative to the master reference cell over a period of several months.

Tests on the reproducibility of these values were carried out. Voltage readings were reproducible to ± 2 mV and current readings were reproducible to ± 0.5 mA (on the 1.0 mA scale). The effects of joggling, remounting, heating, etc., were all in the same range of variation. The overall error in relative average deviation were of the order of ± 1–2%. Therefore a maximum error limit for a power figure would be of the order of 5%, however, the average precision is probably about ± 1.5% for photomf, photocurrent, and resistance readings and probably about ± 3% for photopower calculations. Comparisions with known resistances and power sources indicate that the overall accuracy is comparable to the precision estimates. ± 2% is a reasonable error estimate for both precision and accuracy for all quoted values.

A number of control and exploratory measurements were carried out using the 100 mV scale on the microvoltmeter and the 1 mA scale on the voltohmeter giving an overal total load in the circuit of 250 ohms (with no applied load from the decade box). Power outputs here were on the order of mW instead of μW as with the smaller cell described previously. As might be expected, therefore, with the larger load, the power enhancement was about one order of magnitude smaller than in the case of the smaller cells. It was established with four different cells that the effect was real and also reversible as with the measurements on the smaller cells with several coats of tetraphenylporphyrin on each cell. The average power increase was about 170% for treated cells for a 100 mV setting on the reference cell.

A number of further tests were then performed and the original data reconfirmed. An important difference was noted for the temperature effect. Although a positive temperature coefficient for ambient light and heating with the heat gun as with the smaller cells could not be observed for the larger cells under these conditions, the temperature coefficient tended to zero or only slightly negative as compared with the untreated cell which exhibited a quite large negative temperature effect on power output.

Other tests were then conducted. Dipping the untreated cell in water alone produced at most less than a 1% increase of power which is within the limits of error. It is interesting to note that in the older literature (before 1900), water was supposed to effect the selenium surface and increase the power by about 5%. However, these data were obtained before it was really understood how to reproducibly make the barrier layer by deliberate doping of the selenium. Treatment with all types of acids or acid vapors all lower the output (voltage, current, and power) of the cells. Thus, the large enhancement observed with the use of the acid salts of the porphyrins is even greater than it appears to be. Similarly alkalis also degenerate the cell and lower the output. Solvents for Se such as $CS_2$ also degenerate the cell and lower output levels.

Other methods of applying the porphyrin film were tried, such as dipping into a concentrated solution, evaporating a dilute solution thereof on the surface, or dissolving crystals on the surface and drying. These techniques produced enhancement of the power output but none were as good as dipping into a Langmuir film. This indicates that the short range ordering that is inherent in these Langmuir films plays some mechanistic role in power enhancement. All attempts to electrodeposit a film giving enhanced activity were either negative or resulted in degeneration of the cell. However, with better control and organic solvents as the conducting medium this technique may be a feasible possibility. In addition, although sputtered or vacuum evaporated films have not yet been tried, they probably also would work.

Other tests were performed to determine whether other dyes and semiconductors would also enhance the power output of the cells; or whether this phenomenon is really peculiar to porphyrinic compounds. Methylene blue, although it is a poor organic semiconductor nevertheless photosensitizes and enhances conduction in some organic polymeric semiconductors. It has high absorption in the 600-700 m$\mu$ region as do the porphyrins. However, when applied to a selenium cell, it only acted as a filter, with each coat successively lowering the output further. Trinitrobenzene, tetracyanoethylene, and chloranil, which are all good organic semiconductors that do not absorb in the 600-700 m$\mu$ region, also, either did nothing or lowered output when applied to selenium cells. It would appear therefore, that the effects of the present invention are quite specific for porphyrin like structures. However, other dyes absorbing in this region (600-700 m$\mu$) and having semiconducting characteristics like porphyrins might also give the same effects. Some experiments on the crude action spectrum of the tetraphenylporphyrin treated cells with absorption filters only showed an enhancement in the region of maximum absorption for the untreated Se photopower output.

Since the selenium cells contain a barrier layer they exhibit diode-like action. The application of the porphyrin layers decreases the forward dark resistance (usually by about 10 to 20%) but has little effect on the much larger back dark resistance. These cells exhibit no dark voltage or current thus demonstrating that the effect is not due to a chemical battery-like action. The change in dark resistance appears permanent and roughly correlates with the enhanced power output showing that the change in dark resistance does play some mechanistic role, although it is not sufficient to explain all of the enhanced power output. A treated cell was found to be stable in its power output upon retesting 8 days after treatment and on being left under ambient illumination overnight (about 16 hours).

The effect of varying load was tested with a cell coated with one layer of tetraphenylchlorin, instead of several layers of tetraphenylporphyrin. The treatment both enhances and shifts the optimum load-power locus. In the untreated cell, the maximum power developed is achieved with a load of 500 ohms, while in the treated cell, the maximum power output occurs with a load of 1000 ohms.

Finally, experiments were tried on photovoltaic cells or devices other than selenium cells. A Cu/CuO cell with a front surface lead electrode was crudely assembled. Treatment with tetraphenylporphyrin enhanced the power output by about 30-40%. This effect was reversible as shown by washing the film off with chloroform and recoating. Experiments with CdS cells have been all negative. However, this kind of cell is a back surface cell (i.e., the photoelectrode is on the back and not the front) and because of this, it has not yet been possible to get the porphyrin onto the active surface. Experiments with Si cells have been difficult because the major problem is removing the silicon dioxide layers without damaging the collecting electrodes. Treatment of Silicon cells with alcoholic KOH converts the oxide to silica gel, through which the porphyrin can then be diffused onto the active surface. Using this technique, or by using an abrasive to remove the silicon dioxide before coating with a porphyrin, I have been able to demonstrate a maximum power increase of about 16-20%.

I claim:

1. An article of manufacture comprising a photovoltaic cell having a layer of at least one porphyrinic compound deposited on an exposed semiconductor surface thereof, said layer being at least as thick as a monomolecular layer of said porphyrinic compound.

2. An article as claimed in claim 1 wherein the photovoltaic cell is a selenium cell.

3. An article as claimed in claim 1 wherein the photovoltaic cell is a Cu/CuO cell.

4. An article as claimed in claim 1 wherein the photovoltaic cell is a silicon cell.

5. An article as claimed in claim 1 wherein the porphyrinic compound is a compound containing the porphin structure:

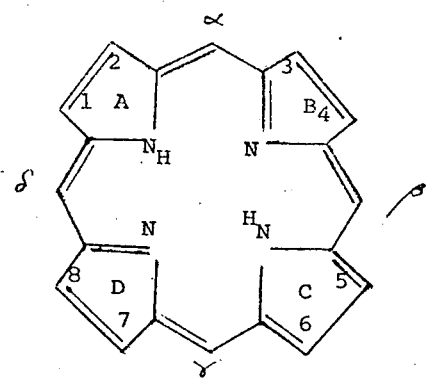

6. An article as claimed in claim 1 wherein the porphyrinic compound is selected from the group consisting of tetraphenyl porphyrin, zinc octaethyl porphyrin, copper tetraphenyl porphyrin, zinc tetraphenyl porphyrin, magnesium tetraphenyl porphyrin, iron tetraphenyl porphyrin chloride, silver tetraphenyl porphyrin, tetra-n-propyl porphyrin, porphin, tintetraphenyl porphyrin dichloride, tetraphenylchlorin $TPPH_2^{+2}(TFA^-)_2$.

7. A method of producing the article of claim 1, comprising depositing on an exposed semiconductor surface of a photocell, a layer of at least one porphyrinic compound, said layer being at least as thick as a monomolecular layer of said porphyrinic compound.

8. A method as claimed in claim 7 wherein the thickness of the layer is from 0.003 up to one micron.

9. A method as claimed in claim 7 wherein the photocell is a selenium, silicon or Cu/CuO cell.

10. A method as claimed in claim 7 wherein the porphyrinic compound is a compound containing the porphin structure:

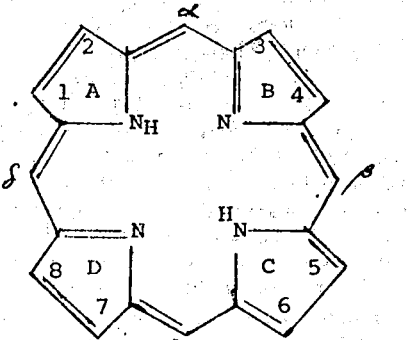

11. A method as claimed in claim 7 wherein the porphyrinic compound is selected from the group consisting of tetraphenyl porphyrin, zinc octaethyl porphyrin, copper tetraphenyl porphyrin, zinc tetraphenyl porphyrin, magnesium tetraphenyl porphyrin, iron tetraphenyl porphyrin chloride, silver tetraphenyl porphyrin, tetra-n-propyl porphyrin, porphin, tintetraphenyl prophyrin dichloride, tetraphenylchlorin $TPPH_2^{+2}(TFA^-)_2$.

12. A method as claimed in claim 7 wherein the photocell is a silicon cell and the method further comprises treating the cell with an alcoholic KOH solution to convert silicon dioxide on the surface of said cell to silica gel and diffusing the porphyrinic compound through said silica gel and onto the silicon semiconductor surface.

13. An article as claimed in claim 1, wherein the thickness of the layer is from 0.003 to 1 micron.

* * * * *